INVENTOR
WARREN C. ROSVOLD
BY [signature]
AGENT

INVENTOR
WARREN C. ROSVOLD
BY [signature]
AGENT

INVENTOR
WARREN G. ROSVOLD
BY [signature]
AGENT

INVENTOR
WARREN C. ROSVOLD
BY [signature]
AGENT

United States Patent Office 3,454,835

Patented July 8, 1969

3,454,835

MULTIPLE SEMICONDUCTOR DEVICE

Warren C. Rosvold, Sunnyvale, Calif., assignor to Raytheon Company, Lexington, Mass., a corporation of Delaware Filed Oct. 31, 1966, Ser. No. 590,719
Int. Cl. H01l 13/00, 5/00
U.S. Cl. 317—101 12 Claims

ABSTRACT OF THE DISCLOSURE

A semiconductor device which comprises a plurality of active semiconductor units located in spaced dielectrically isolated relation in a single assembly, the device comprising a thin crystalline grid upon which the active units are located and which is insulated from the active units by a layer of dielectric material, the complete structure, including the grid, being supported by a thin layer of crystalline material disposed on the opposite side of said grid.

This invention relates to novel semiconductor devices embodying a plurality of active semiconductor areas which are electrically isolated from one another by dielectric material, and has particular reference to such devices wherein the isolating dielectric material is a thin polycrystalline handle which supports the active areas in the required assembled structure.

Semiconductor devices often embody two or more active areas which, in order to function properly, must be maintained in desired electrically isolated relation with respect to one another. For example, such a device may embody a transistor and a resistor which are supported in electrically isolated relation with such supporting means often taking the form of a dielectric matrix or handle on which separate active areas are secured as dots or islands in suitable spaced relation. In other instances, the device comprises a matrix of semiconductor material containing the active areas within the body thereof and spaced apart or isolated by diffused or inserted channel-like areas of different conductivity, intrinsic, or dielectric material. In still other cases, the active areas are isolated within a matrix or body by air gaps formed by etching or other removal technique.

A still further improvement in the art of providing electrically isolated active areas in a semiconductor device is by mounting a wafer of selected single crystal material upon a thick polycrystalline handle and thereafter isolating the areas by etching techniques whereby the areas will appear as spaced dots or islands on the surface of the handle. However, in processing such a device relatively high temperatures are often required such as, for example, when thermally growing oxide layers on the surfaces of the device, followed by cooling, which causes deformations to occur in the structure due to different expansion and contraction coefficients of the single crystal and polycrystalline materials. Such deformations very often occur as bowing which makes it very difficult to thereafter uniformly lap, abrade or machine the surface of the single crystal material to produce a uniformly thick layer wherein the active components may be formed.

Thin polycrystalline materials have also proved to be too inherently weak for use as handles on devices of the type described and breakage often occurs when subjecting these materials to pressures such as are encountered when mechanically processing the devices. However, the proces of depositing a polycrystalline material of a thickness suitable for use as a handle is relatively time consuming and the quality of the deposit degrades with increasing thickness. This causes nodes and peaks, which irregularities must be removed by additional processing steps to insure surface planarity.

The present invention utilizes a thin polycrystalline layer which provides only a very thin support for the active regions, the thin support being found to overcome all of the aforementioned deficiencies of the prior art. In the presently described device the strength of the structure is derived from a continuous grid of single crystal material which surrounds each active region and is bonded to and reinforces the polycrystalline handle during the processing of the individual active regions, the grid thereafter being removed in selected areas overlying the handle to electrically isolate the individual active areas, such removal of grid areas being accomplished by precision etching, thus eliminating the need for determining single crystal thicknesses by difficult-to-control mechanical methods such as lapping and polishing.

Other objects and advantages of this invention will become apparent from the following description taken in connection with the accompanying drawings wherein.

Figure 1:
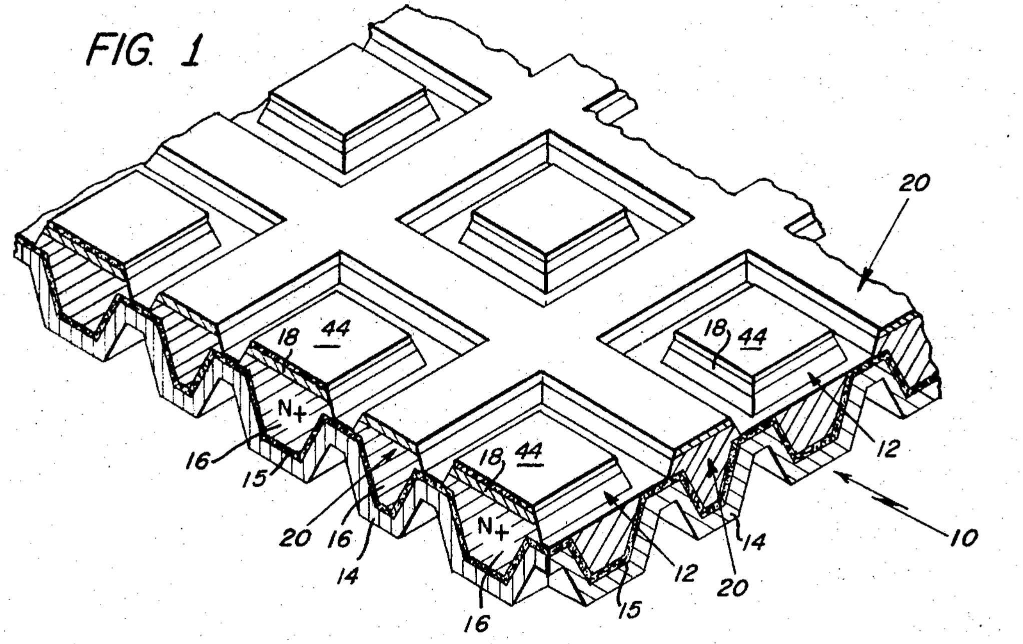
FIG. 1 is a fragmentary isometric view partly in section of a mesa-type device embodying the invention.

Referring more particularly to the drawings, FIG. 1 illustrates a portion of a semiconductor wafer or chip 10 on which a number of mesa-type "active areas" 12 have been formed in accordance with this invention. The "active areas" or units each comprise an island or mesa which is to be subsequently provided with two or three electrodes for the formation of diodes, transistors, resistors, or the like, as will be described. The active areas, islands, or mesas are supported and electrically isolated from one another by a layer 14 of polycrystalline silicon material and an intermediate dielectric layer 15 of oxide, thus being retained in fixed spaced relation as shown.

The polycrystalline layer or support 14 is relatively thin in accordance with this invention, and the active areas 12 each comprise a single crystal N+ layer 16 upon which lies an epitaxially deposited N layer 18. The electrodes of each active area are to be formed within the N layer 18, as will be described hereinafter in connection with FIG. 7.

The thin polycrystalline layer 14 is reinforced by the oxide layer 15 and the entire supporting structure is further reinforced by a grid 20 of single crystal silicon, which grid 20 encircles each active area 12. In the structure of FIG. 1, the grid 20 is spaced from the respective active areas 12 so that the active areas are in effect mesas or islands. However, in accordance with the broadest aspects of this invention the surrounding grid may be closely contiguous with the active areas, as shown in FIG. 2, and dielectrically isolated therefrom by extensions of the dielectric oxide layer, thus providing a structure wherein the surfaces of the active areas and the surrounding areas are uniplanar.

Figure 2:
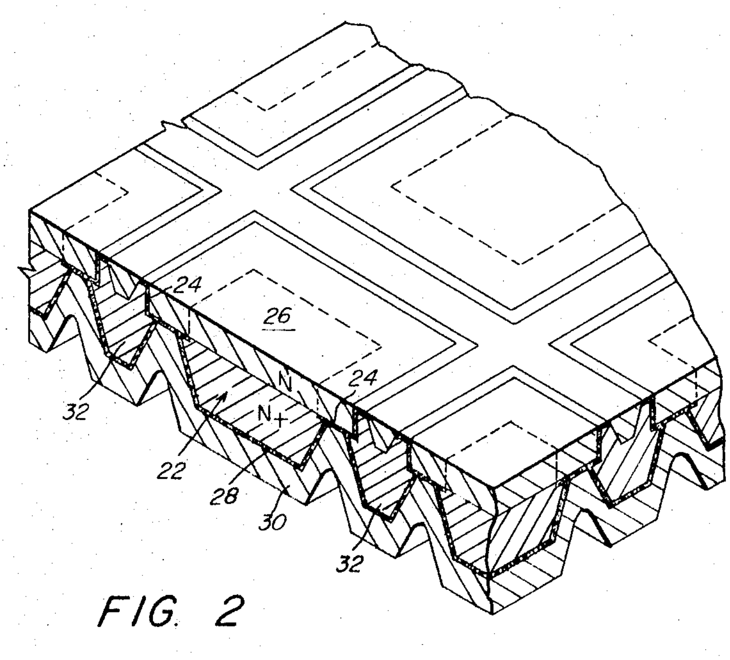
FIG. 2 is a fragmentary isometric view partly in section of a planar-type device embodying the invention.

Referring more particularly to FIG. 2, the active areas are indicated by numeral 22 and comprise portions of an initially continuous N+ layer of single crystal silicon which is provided on one side with etched cavities and a layer of oxide 24, and an N type semiconductor material 26 is deposited in the cavities as shown. The opposite side of layer 22 is thereafter etched in selected areas down to the oxide layer 24 and coated with a layer 28 of oxide. The etched areas on this surface are filled with a thin layer of polycrystalline material 30, thus forming a handle for the structure which is reinforced by the oxide layer 28 and by a grid 32 of single crystal material which is dielectrically isolated from the active areas by oxide. In this structure the exposed surfaces of the active areas 22 are uniplanar with the surrounding areas, thus providing a continuous surface which is free of irregularities and permits contacts to be made to electrodes in the active areas by conventional metallizing techniques.

In the manufacture of a circuit device of the type shown in FIG. 1, there is first provided a single crystal silicon chip or wafer which preferably has a resistivity of about .01 ohm cm. and less than about 2000 dislocations per square centimeter. The crystal ingot from which the wafer is grown is sliced in the [100] plane and a flat is ground in the [100] plane. The flat is used for alignment in the proper crystallographic orientation which is necessary for the etch process, to be hereinafter described. The wafer is processed by conventional lapping, polishing and etching processes to a desired resultant size, such as about six mils thick and one inch in diameter, for example.

The single crystal wafer or chip is suitably doped in any well-known manner to provide it with the selected N or P type conductivity characteristics and of such concentration of dopant as will provide the desired resistivity of about .005–.015 ohm cm., whereby the conductivity may be termed as N+ or P+. This wafer will eventually become the N+ layer 18 of the active areas 12 in FIG. 2.

Figure 5:
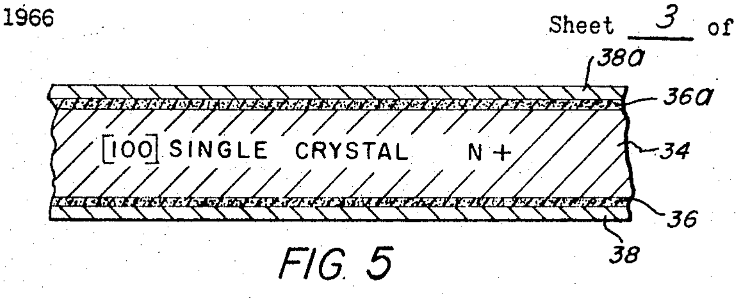
FIGS. 5–9 are diagrammatic views illustrating various steps of the process of manufacturing a semiconductor device of the type shown in FIG. 1.

The wafer, indicated by numeral 34 in FIG. 5, is prepared to receive a polycrystalline deposition on one side and an epitaxial deposition on the other side by first oxidizing, whereupon it is coated upon opposite surfaces with layers 36 and **36*a* of silicon dioxide, this being done by any of the known thermal growing or other oxidation techniques to form the oxide film to a thickness of two to four (preferably three) microns. Both oxide coated surfaces of the wafer are coated with a photoresist material such as the solution known as KPR, sold under that terminology by Eastman-Kodak Co., for example, and the coated wafer is prebaked to a temperature at which the photoresist decomposes and vaporizes, leaving a residue 38 and 38*a*** which covers the silicon dioxide surfaces uniformly with nucleation centers.

The wafer thus is oxidized with the layers 36 and **36*a*** of silicon dioxide about 2–4 microns thick thereover, and these oxide layers are masked with a photoresist which is provided in a predetermined pattern so as to define the areas in which active mesa areas and grid areas are to be formed as well as the areas which are to be removed for isolation purposes, as will become apparent from the following description.

The particular masking technique used here is not in iteself unique insofar as this invention is concerned and, therefore, will be only briefly described herein. A photographic film is prepared with the desired pattern thereon, and the wafer is provided with the coatings 38 and **38*a* of photoresist material, such as KPR, which overlies the silicon dioxide layers and 36*a* respectively. Coatings 38 and 38*a*** are exposed through the film to ultraviolet or other radiation to which they are sensitive, and developing then takes place by dipping the wafer in a solution such as trichloroethylene to remove unsensitized KPR. The wafer is then baked at about 1500 C. for about 10 minutes whereupon the oxide supports thereon a resultant hardened photoresist mask having the desired configuration or pattern.

The silicon dioxide is then removed in the exposed window areas of the photoresist pattern. This is done by placing the wafer in a solution containing about one part of hydrofluoric acid (HF) and nine parts of ammonium fluoride ($NH_4F$) to etch away the exposed areas of silicon dioxide, following which it is rinsed in water and dried. The remaining photoresist may now be removed if desired by a solution of one part sulphuric acid and nine parts of nitric acid at about 100° C. for about ten minutes. However, the photoresist may be left on if desired because it will be automatically removed in the following mesa etching process.

To etch the exposed surfaces of the wafer, the wafer is placed in a suitable rack, and heated in boiling water to preheat it to the temperature of the etching solution, that is, about 115° C. The etching solution is a saturated solution, i.e. at least 25% of sodium hydroxide (NaOH) in water, preferably in an amount of 33%. The preheated wafer is subjected to the etchant for the time necessary to slightly etch the layer 34 to remove material down to a depth suitable to be apparent when a subsequent epitaxial layer is deposited. This depth may be about 10 microns. This etching takes place along the [100] planes of the single crystal material as is explained more fully in copending U.S. application Ser. No. 520,506, filed by Warren C. Rosvold and assigned to the same assignee as the present invention.

Figure 6:
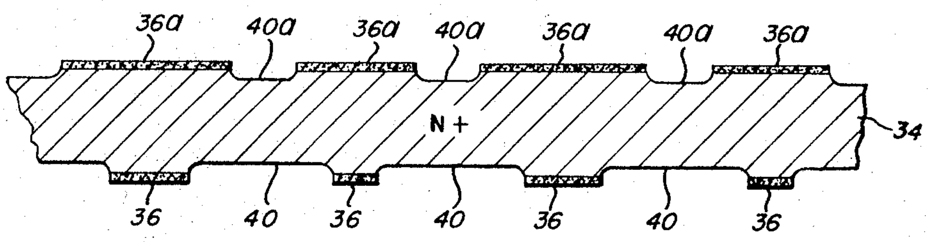

At this stage, the wafer will appear substantially as shown in FIG. 6 wherein the N+ single crystal material will have cavities or indentations 40 on one side which register with indentations **40*a* on the opposite side of the layer 34**.

To form the mesas 12, the wafer is mounted by sealing its upper surface by means such as a wax bond on a glass slide and then placing it in a suitable rack, and thereafter following the etching process described above. This second etching occurs only in the bottom or unsupported surface of the wafer and is allowed to take place for about fifteen minutes, or for a time sufficient to reduce the thickness of the wafer between the indented areas to about 0.001 to 0.002 inch. Etching by this method along the [100] cleavage planes is linear and continues unabated until the device is removed from the etching solution, rinsed in deionized water and NaOH on the wafer is neutralized by a solution of acetic acid, followed again by rinsing, and drying.

Figure 7:
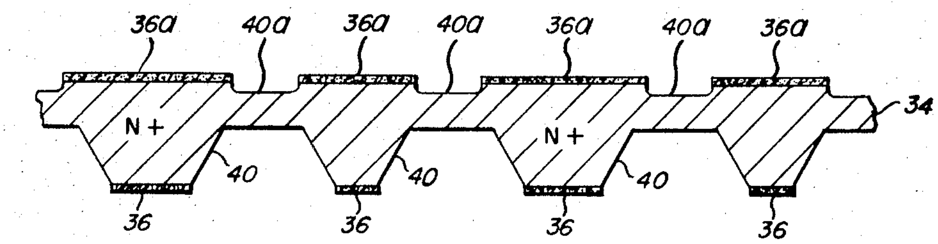

The device now appears as shown in FIG. 7 and it will be apparent that this last etching process served to deepen the indented areas 40, and the shape of the mesas now becomes more apparent. This single crystal N+ layer 34 now itself becomes a support which includes the grid areas 20, forming a relatively stron gand indestructable grid or handle compared with prior art polycrystalline handles.

Figure 8:
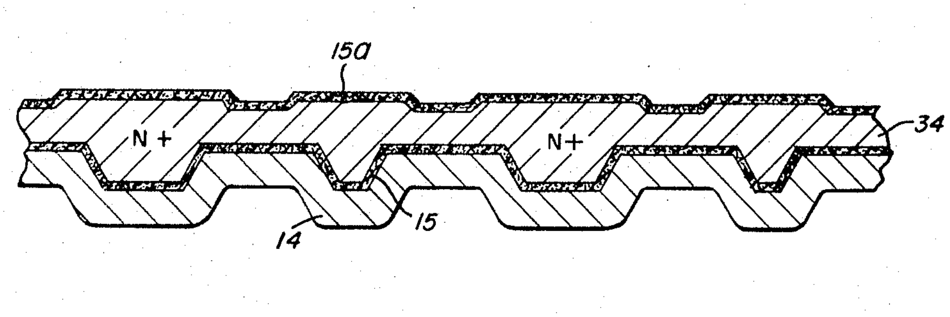

The wafer is now oxidized, in the manner described hereinbefore, to provide the entire bottom surface with a dielectric isolation layer 15 (FIG. 8) of a thickness to provide the degree of isolation required. For example, a thickness of at least 2 microns will be suitable for most purposes. Both sides of the wafer will be oxidized simultaneously, however, and it may be desirable to remove the previously grown oxide layers 36 and **36*a* before growing the new oxide layers 15** so that more accurate control of the thickness of the bottom oxide is achieved.

At this point in the process the polycrystalline layer 14 is vapor deposited upon the bottom oxide-coated side of wafer 34. To form layer 14, the wafer is placed in a furnace which is brought to a temperature of about 1200° C., at which time silicon tetrachloride, silane or tetraorthosilicate is reacted with a reducing compound such as hydrogen onto the wafer over the silicon dioxide coating 15. This process is conventional and may be performed in a single step for about 20 minutes to form a layer 14 of about 0.002 to 0.003 inch thickness, or may be performed in a series of steps to provide several contiguous layers of polycrystalline silicon of the required total thickness.

Polycrystalline layer 14 at this stage merely reinforces the handle formed by the grid 20 during the subsequent processing of the device but eventually will become the sole or principal bulk support or handle for the completely isolated active areas 12, as will become apparent.

The oxide on the top of the wafer, that is, on the side opposite the polycrystalline layer 14, is now removed, as by the acid treatment described hereinbefore for removal of silicon dioxide, and the epitaxial layer 18 is deposited over the entire upper surface of the wafer 20.

Figures 9, 10:
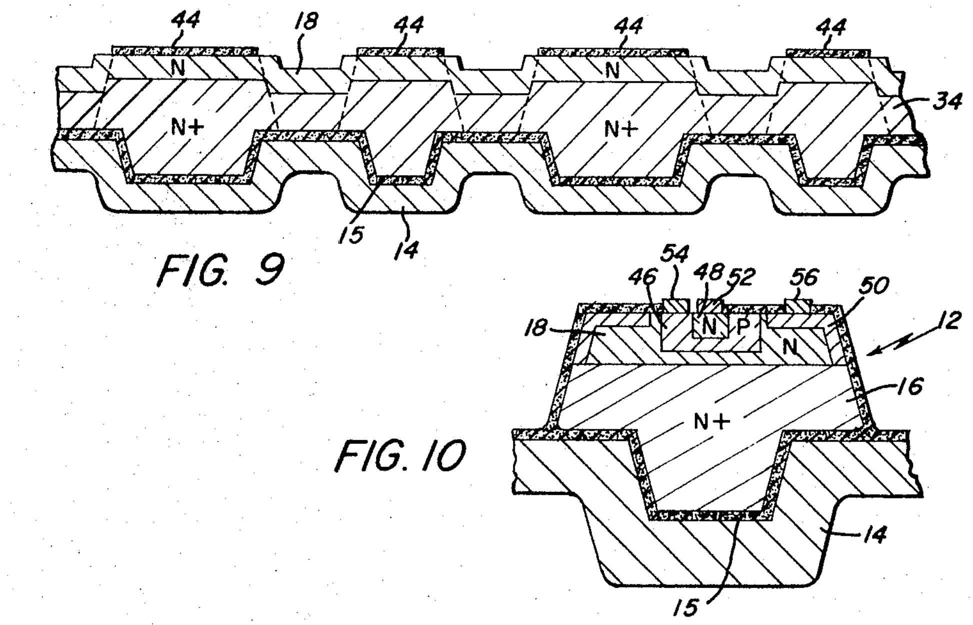
FIG. 10 is an enlarged vertical sectional view of a single completed active area or mesa of the device of FIG. 1.

Layer 18 is an arsenic doped N layer (FIG. 9) on the surface of N+ layer 34. This layer 18 is a single crystal epitaxy formed by reacting a silicon compound such as silicon tetrachloride, silane or tetraorthosilicate with a reducing compound, such as hydrogen, for example, in vapor form onto layer 34 in a furnace at about 800–1200° C. for about 8–15 minutes to produce a thickness of 14–16 microns. Layer 18 is doped with arsenic, antimony, phosphorus, or other N type dopant in an amount sufficient to provide it with a resistivity of about 3–5 ohms cm. However, other thicknesses and amounts of doping may be employed to provide a desired resistivity in accordance with the device requirements.

Figure 3:
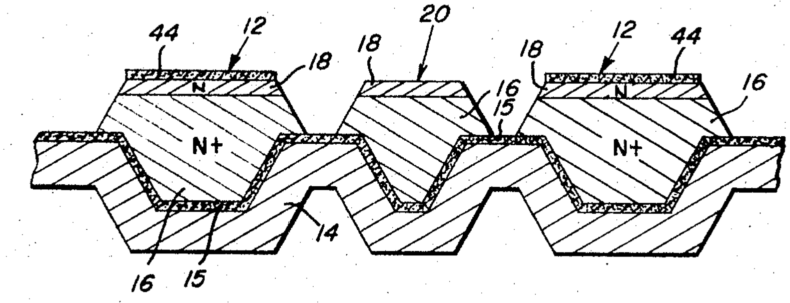
FIG. 3 is an enlarged vertical sectional view through two of the active areas of the device of FIG. 1.

At this point in the process the wafer is again oxidized, as described hereinbefore, to provide an oxide layer 44 over the N type epitaxial layer 18, and windows are formed in oxide layer 44 by the photoresist method described hereinbefore, the windows being aligned with the indentations which are inherently formed in the upper surface of the N+ layer 34 because of the deposition over the underlying indentations 40*a*. Now using conventional etching or precision chemical milling techniques, the epitaxial layer material 18 is removed completely down to the silicon dioxide layer 28, thus separating the islands or mesas 12 into separate, discrete, spaced and electrically isolated active areas, all supported upon the polycrystalline handle 14, as shown in FIG. 3.

All exposed silicon dioxide is now removed from the tops of the mesas 12 and the device is again reoxidized to provide thereon a new relatively smooth layer of silicon dioxide one micron thick (for example). Then the base electrodes 46 (FIG. 10) are diffused into each mesa 12 by conventional diffusion techniques. Briefly, this is done by masking with KPR, removing silicon dioxide to open windows in the tops of the mesas and predepositing boron (P type dopant) on the exposed N layers 18 within the windows by placing the device in a furnace at about from 900° C.–1200° C. for about from 15–20 minutes, depending upon the particular concentration of impurities which are required to provide the resultant desired electrical characteristics in the device.

The device is then removed from the furnace and dipped in HF to remove boron from the oxide and then, after testing, is replaced in a furnace at about 1200° C. containing wet oxygen for about one hour to drive the boron into the N layer. Here again, the time required may be varied depending upon the resultant desired electrical characteristics. This also simultaneously reoxidizes the device. The P-N junction between the electrode 46 and N layer 18 will, in this example, lie about 3.5–4 mils from the top of the mesa. This provides the mesa with diode characteristics.

However, a transistor may be formed in a mesa by diffusing or otherwise forming emitter and collector electrodes 48 and 50 simultaneously by masking with KPR, opening windows in the oxide, and diffusing phosphorus or other N type dopant from phosphorus oxychloride gas in a furnace at about 1100° C. for about 15 minutes, then subjecting the device to dry oxygen at a temperature of about 1100° C. for about 25 minutes to drive the phosphorus into the mesas to a depth of about 2–3 microns, for example. A dip in HF for several seconds then will remove undesired phosphate glass formed over the wafer by combination of the phosphorus and oxide.

Then contact windows are opened in the required areas by photoresist masking and removing oxide, whereupon aluminum is evaporated by well-known techniques over the device. Then by again masking with photoresist and then etching with any suitable aluminum etchant, the aluminum is removed from all areas except the contact areas overlying the respective electrodes. An organic solvent such as dibutyl Cellusolve is then used to remove the photoresist, and the aluminum is alloyed by heating in nitrogen to a temperature of about 610° C. for about ten minutes, thus providing the contacts 52, 54 and 56 to the electrodes. These metallized contacts then may be affixed to the ends of the wires, not shown, which may be connected to suitable leads whereby the electrodes may be supplied with suitable biases from external sources.

It is to be understood that the methods set forth in the foregoing description are applicable to the simultaneous making of any number of matched diodes or transistors on a single wafer, and that the wafers are subsequently diced into groups or units for use in various structures.

Figure 4:
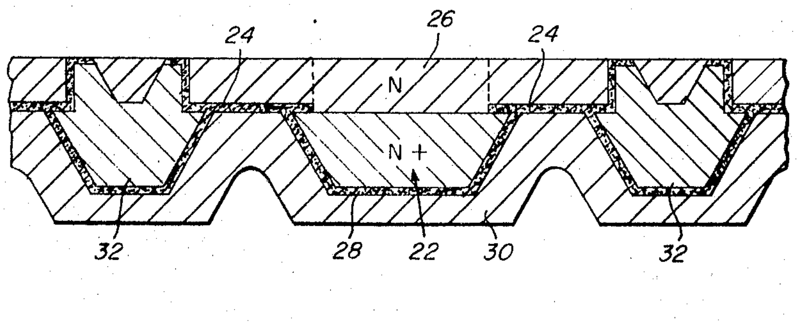
FIG. 4 is an enlarged vertical sectional view through two of the active areas of the device of FIG. 2.

The formation of uniplanar devices as shown in FIGS. 2 and 4 is quite similar to the process for forming the described mesa structure. In producing this modified structure, a wafer 58 is fabricated and oxidized, and then coated with a photoresist material to form an oxide pattern as described above in connection with FIGS. 5 and 6. In the present instance, the pattern will appear as shown in FIG. 11 wherein the wafer is indicated by numeral 58 and the oxide coatings on opposite sides thereof by numerals 60 and 60*a*.

Figure 11:
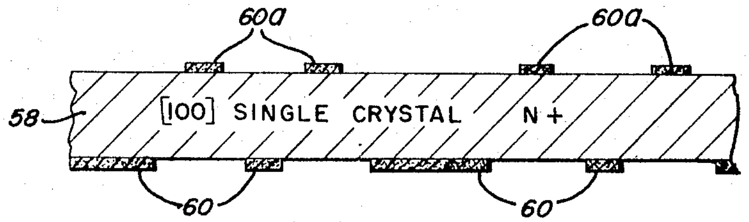
FIGS. 11–13 are diagrammatic views illustrating various steps of the process of manufacturing a semiconductor device of the type shown in FIG. 2.

The lower or bottom surface, as seen in FIG. 11, is suitably coated or masked and the opposite surface is etched as described above by an NaOH solution along the [100] planes of the single crystal material to a depth consistent with the thickness of an epitaxial layer to be subsequently deposited on this surface. This depth will vary in accordance with the particular device requirements such as 14–16 microns, for example. The etched wafer 58 is then oxidized again and the oxide on the etched surface is removed in selected areas in the manner set forth hereinbefore to provide an oxide pattern having windows wherein single crystal material is to be deposited.

Figure 12:
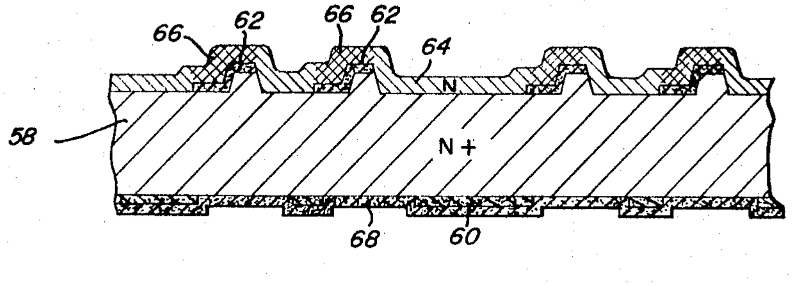

Referring to FIG. 12, the oxide pattern 62 is shown and the epitaxial layer 64 is deposited thereover and over the exposed surfaces of the N+ layer 58. As is well known, the epitaxial layer will be single crystal in form where it directly overlies the single crystal material 58 and will be polycrystalline in areas 66 where it overlies the oxide 62. Layer 64 is an arsenic doped N layer and is formed by reacting a silicon compound such as silicon tetrachloride, silane or tetraorthosilicate with a reducing compound such as hydrogen in vapor form onto the wafer 54 in a furance at about 800–1200° C. for about 8–15 minutes to produce a thickness of 14–16 microns. Layer 64 may be doped with antimony, phosphorus, or other N type dopant if desired, and preferably has a resistivity of about 3—5 ohms, cm., but such parameters may be varied depending upon the device requirements.

Figure 13:
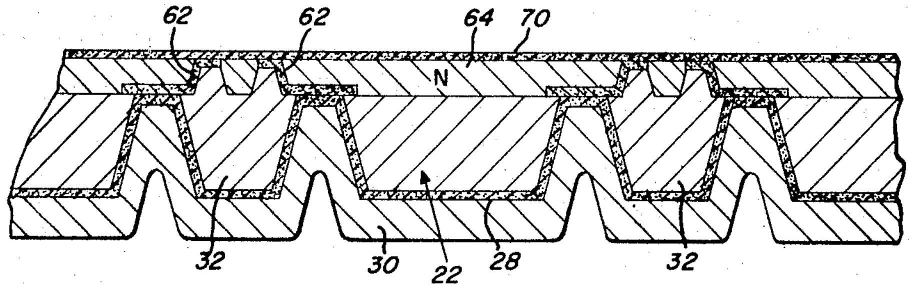

At this point in the process, wafer 58 is polished to level the raised polycrystalline areas 66 down to the projecting portions of the oxide 62. This surface now appears completely planar as shown in FIG. 13 and it will be noted that this polishing step is accomplished to the point where, when the oxide 62 is reached, the thickness of the epitaxial layer is established. Thus, the depths of the initial etched indentations or cavities actually control the thickness of the epitaxial layer, since when the polishing step is accomplished the epitaxially deposited silicon is relatively easily removed but when the hard silicon oxide is reached the polishing process becomes much more difficult and thus is readily apparent.

The opposite surface of the wafer 58 is now prepared for the etching step whereby the active areas 22 are isolated. This is done by applying a photoresist pattern to the oxide coating 68 (FIG. 12) and etching the oxide in the manner set forth hereinbefore to produce an oxide pattern. Then the wafer 58 is etched through the windows in the oxide pattern utilizing the crystal oriented etch technique described above and in the aforementioned copending application Ser. No. 520,506, whereby the single crystal material is etched along its [100] crystallographic planes. Such etching is continued for a time sufficient to etch the wafer 58 clear through to the oxide 62 on the opposite surface and stops automatically when this oxide has been reached.

After the usual rinsing and drying, the etched surface is reoxidized to provide the isolated active areas 22 with a dielectric coating 28. This step also simulanteously provides the opposite surface with an oxide coating 70, such oxidation being accomplished by any of the known processes. If desired, previously applied oxide coatings 60 and 68 may be removed, and in FIG. 13 coatings 60 and 68 have been removed.

Using the polycrystalline deposition process described in connection with the formation of handle 14 in the device of FIG. 1, a thin handle 30 is now deposited over the back of wafer 58, that is, over the deeply etched side thereof. This handle 30 may be deposited to any thickness but is preferably made thin, about 0.002–0.003 inch thick, by reacting silicon tetrachloride, silane or tetraorthosilicate with a reducing compound onto the wafer in a furnace at about 1200° C. for about 20 minutes.

Thus, there is produced a multiple semiconductor device embodying several dielectrically isolated active areas in a single wafer, the areas being supported by a grid 32 reinforced by handle 30. When this structure has been completed the active areas may be provided with electrodes in the same manner as described above in connection with the active area shown in FIG. 10. However, since the surfaces of the active areas 22 and the electrodes therein are uniplanar with the surrounding grid 32, contacts to the electrodes can be easily made by conventional metallizing processes.

From the foregoing it will be apparent that a novel semiconductor device has been achieved by the novel processes described. It is to be understood, however, that various modifications and changes in the invention shown and described may be made by those skilled in the art. For example, although the wafers 34 and 58 have been described as being of N+ conductivity and the superimposed epitaxial layers 18 and 64 of N type conductivity, such may be of opposite P+ and P type if desired, in the usual manner of producing semiconductor devices.

Thus, it will be apparent that all of the objectives and advantages of this invention have been accomplished by the novel structure and processes set forth. It will be further understood that various other modifications and changes in this invention may be made by those skilled in the art without departing from the spirit of the inventioon as expressed in the accompanying claims.

I claim:

1. A semiconductor device comprising a plurality of active units located in spaced dielectrically isolated relation in a single assembly, supporting means for said units comprising a grid of crystalline material having said active units on a first surface thereof and having raised portions encircling portions of the active units, a layer of dielectric material disposed over said first surface between said active units and grid including said raised portions of the grid, and a thin layer of crystalline material disposed on the opposite side of said layer.

2. A semiconductor device as set forth in claim 1 wherein said grid is single crystal material.

3. A semiconductor device as set forth in claim 1 wherein said thin layer is polycrystalline.

4. A semiconductor device as set forth in claim 1 wherein said active units are mesas and said grid portions are spaced from the peripheries of said mesas.

5. A semiconductor device as set forth in claim 4 wherein said grid is single crystal material and said thin layer is polycrystalline.

6. A semiconductor device as set forth in claim 1 wherein said grid portions closely encircle portions of the active units and are spaced therefrom by dielectric material, and the exposed surfaces of said active units and adjacent grid portions are coplanar.

7. A semiconductor device as set forth in claim 6 wherein said grid is polycrystalline.

8. A semiconductor device comprising a plurality of active semiconductor units located in spaced dielectrically isolated relation to one another in a single assembly, said units each embodying a major portion of low resistivity semiconductor material and a layer of high resistivity semiconductor material on a surface of said major portion, a thin supporting layer of polycrystalline material supporting said units in spaced relationship, a layer of dielectric material interposed between said major portions and said supporting layer, and a grid mounted on said dielectric layer and reinforcing said supporting layer, said grid having portions encircling said major portions of the respective units in spaced relation therewith.

9. A semiconductor device comprising a supporting layer, a dielectric coating overlying one surface of said supporting layer, a first single crystal layer of semiconductor material of selected conductivity type and low resistivity overlying said dielectric coating, a second layer of single crystal semiconductor material of the same conductivity type as said first layer overlying said first layer, said second layer being of higher resistivity than said first layer, and channels in said device extending completely through said first and second layers and dividing said layers into a plurality of active semiconductor units each of which is encircled by and spaced from a grid, and electrodes in said second layer of individual active units.

10. A semiconductor device as set forth in claim 9 wherein said supporting layer is polycrystalline semiconductor material.

11. A semiconductor device comprising a supporting layer having a plurality of recesses in one surface thereof, and having a dielectric coating extending over said recessed surface, a deposit of low resistivity single crystal semiconductor material of selected conductivity type residing in each of said recesses, a layer of high resistivity semiconductor material of the same conductivity type as said deposits overlying said deposits and the coated areas of the supporting layer between the deposits, said layer being single crystal material where it overlies the deposits and being polycrystalline where it overlies said coating, extensions of said dielectric coating being disposed between peripheral portions of said layer and adjacent contiguous portions of the device for electrically isolating said layer into spaced areas defining with the underlying deposits a plurality of active semiconductor units, and electrodes in said spaced areas of said layer, the exposed surface of said active units being coplanar with the adjacent surrounding surfaces of the device.

12. A semiconductor device as set forth in claim 11 wherein said supporting layer is polycrystalline semiconductor material.

References Cited

UNITED STATES PATENTS 3,381,182 4/1968 Thornton.

ROBERT K. SCHAEFER, *Primary Examiner.*

J. R. SCOTT, *Assistant Examiner.*

U.S. Cl. X.R.

317—235